United States Patent [19]

Sangyoji et al.

[11] Patent Number: 4,810,058
[45] Date of Patent: Mar. 7, 1989

[54] EXPOSURE DEVICE UTILIZING A LIQUID CRYSTAL SHUTTER MATRIX

[75] Inventors: Kazuo Sangyoji; Ichiro Sasaki, both of Nagoya, Japan

[73] Assignee: Brother Kogyo Kabushiki Kaisha, Japan

[21] Appl. No.: 113,233

[22] Filed: Oct. 23, 1987

[30] Foreign Application Priority Data

Oct. 24, 1986 [JP] Japan .................................. 61-254539
Nov. 14, 1986 [JP] Japan .................................. 61-272388
Feb. 27, 1987 [JP] Japan .................................. 62-46305

[51] Int. Cl.$^4$ ............................................. G02F 1/13
[52] U.S. Cl. .................................. 350/331 R; 350/333; 350/334; 346/160
[58] Field of Search .................. 350/331 R, 332, 333, 350/334, 330; 346/160, 107 R, 108, 160.1

[56] References Cited

U.S. PATENT DOCUMENTS

| | | | |
|---|---|---|---|
| 4,386,836 | 6/1983 | Aoki et al. | 350/331 R X |
| 4,595,259 | 6/1986 | Perregaux | 350/331 R |
| 4,743,927 | 5/1988 | Sasaki | 346/160 |
| 4,745,433 | 5/1988 | Fujimura et al. | 350/331 R X |

Primary Examiner—Stanley D. Miller
Assistant Examiner—Richard F. Gallivan
Attorney, Agent, or Firm—Kane, Dalsimer, Sullivan, Kurucz, Levy, Eisele and Richard

[57] ABSTRACT

An exposure device for forming an image on a photosensitive member is disclosed, which is provided with a shutter unit disposed between the photosensitive member and a light source. The shutter unit includes a plurality of shutter elements adapted to open and close for selective transmission of the light from the light source therethrough. Further provided are driving means for reciprocally moving the shutter unit along the row of the shutter elements, and control means for controlling opening and closure of the shutter elements.

With the above constructed exposure device, the shutter elements are repeatedly opened or closed when moved to a different position along the row of shutter elements by means of driving means. An image of higher resolution is thus formed on the photosensitive member by means of the light passed through the light transmitting area corresponding to the shutter element kept open.

21 Claims, 8 Drawing Sheets

EXPOSURE DEVICE UTILIZING A LIQUID CRYSTAL SHUTTER MATRIX

BACKGROUND OF THE INVENTION

This invention relates to an exposure device for forming an image on a sensitized element by means of light transmitted through a shutter unit provided with shutter elements adapted to selectively open and close.

Conventionally, a liquid crystal display panel has been adopted as one of the above shutter units, which generally includes multiple liquid crystal elements spaced at certain intervals. The liquid crystal elements are each adapted to open and close in response to certain picture image informations. Backlighting the panel thus configured develops an image displayed on the panel. For reproducing the image displayed on this panel, there has so far been a condensing lens disposed between the panel and the sensitized paper so that the image on the panel has been formed on the sensitized paper by way of the lens.

In such an arrangement as described above, the panel has been constantly fixed relative to the sensitized paper with no relative mobility. Consequently, the problem has been such that the resolution of the image could never surpass that obtained by the outer dimension of the light transmission area of each of the liquid crystal display elements forming the panel.

Further, the sensitized element is placed close to the image forming side of the shutter unit at a certain small distance therefrom, and there is no means provided between the image forming side of the shutter unit and the sensitized element. Accordingly, when the light source is turned on with both side elements of adjacent three elements kept open, and center element thereof kept closed, the light passed through opened shutter elements is allowed to reach not only the underside of the two opened shutter elements kept open but also that of the shutter element kept closed. Also, it may be irregularly reflected between the sensitized element and the underside of the shutter elements to allow some reflections to pass to the underside of the shutter element kept closed, which results in unintended exposure of a corresponding area on the sensitized element. Likewise, the light passed through the surrounding of each shutter element is admitted to the underside of the center shutter element kept closed to expose some area of the sensitized element. This results in an image with its exposed part not clearly delimited from the unexposed part not formed on the sensitized element.

On the other hand, a color recording device for recording images on a sensitized sheet using a color liquid crystal panel is becoming a major subject of studies with a recent outstanding progress in the color liquid crystal display technique. The color liquid crystal panel is composed of a filter placed on a known liquid crystal panel serving as a shutter. The filter consists of three display elements of red (R), green (G) and blue (B) which are equal in size to the picture elements on the liquid crystal panel. A set of these red, green and blue display elements is called a cell which serves as a unit for color display. There are in general two types of color recording device, in one of which the color liquid crystal panel closely adjoins a so-called light/pressure sensitized paper. In the other type of such device, there is a space between the color liquid crystal panel and light/pressure sensitized paper, in which an optical system is interposed to allow images on the color liquid crystal panel to be formed on the sensitized paper. In any such color recording device, the light ray passed through the display elements of each cell of different colors acts upon the sensitive component on the sensitized paper, with the result of a color image developed on the sensitized paper.

However, the following problems are encountered because the resolution of light/pressure sensitized paper is generally higher than that of the color liquid crystal panel. For instance, a uniformly vivid red image formed on the color liquid crystal panel turns to somewhat blackish red rather than bright red when projected and exposed on the sensitized paper. Assuming the light is thrown to a particular cell of the color liquid crystal to obtain a red image, it is passed through the R element so that the area of the sensitized paper corresponding to the R element is exposed to light, while the area corresponding to the G and B elements is not exposed because light is not admitted through them. Consequently, unlike the color liquid crystal panel in which bright red is developed by raising the brightness of red picture element, the one third of the area corresponding to the cell on the sensitized paper is colored red, while the remaining two third area is blackened. As a result, the image formed on the sensitized paper fails to present bright colors as a whole.

Also, if one attempts to create white on the sensitized paper by allowing the light to pass through the filter for all the R, G and B picture elements within the cell, what is available is only a grayish-white image in a color recording device of this nature.

SUMMARY OF THE INVENTION

It is therefore an object of the invention to provide an improved exposure device which ensures a reproduced image with higher resolution.

Another object of the invention is to provide an exposure device which shuts out any light passing through the surroundings of the shutter elements adapted to selectively open and close in response to certain picture image informations thereby providing a clear image with its exposed part definitely delimited from its unexposed part.

A further object of the invention is to provide an exposure device in which the light radiated from the light source is efficiently projected on the shutter elements to form a clearer image in a minimized exposure time.

A still further object of the invention is to provide an exposing device for forming a color image in which bright colors can be developed on the sensitized paper even if the resolution of the sensitized paper is higher than that of the color liquid crystal panel.

According to the invention, there is provided an exposure device for forming an image on a photosensitive member comprising a light source; a shutter unit disposed between said photosensitive member and said light source, said shutter unit including a plurality of shutter elements adapted to open and close for selective transmission of the light from said light source therethrough; driving means for reciprocally moving the shutter unit along the row of said shutter elements; and control means for controlling opening and closure of said shutter elements.

The above constructed exposure device allows said control means to open or close said shutter elements upon movement to a different position along the row of said shutter elements by means of said driving means. An image of higher resolution is thus formed on the sensitized element by means of the light passed through the light transmitting area corresponding to the shutter element kept open.

Optionally, the exposure device of the invention may comprise a light source, a shutter unit disposed between said photosensitive member and said light source, said shutter unit including a plurality of shutter elements adapted to open and close for selective transmission of the light from said light source therethrough, and a light shielding member provided to said shutter unit, to prevent light from passing through the surroundings of said shutter elements, said light shielding member being provided with a plurality of rectangular light transmitting areas, each of which is located to oppose to the corresponding pair of transparent electrodes.

According to the above constructed exposure device, when light is radiated from the light source onto the shutter elements selectively opened or closed in response to certain information, the light shielding member keeps light away from the surroundings of the shutter elements to allow the part of photosensitive member corresponding to the open shutter element only to be exposed, thereby providing a clear image with its exposed part definitely delimited from its unexposed part.

Further, according to the invention, an exposure device may be modified as to comprise a light source, a shutter unit disposed between said photosensitive member and said light source, said shutter unit including a plurality of shutter elements adapted to open and close for selective transmission of the light from said light source therethrough; a light shielding member provided on one side of said shutter unit facing said photosensitive member to prevent light from passing through shielding member the surrounding of said shutter elements; and light condensing means provided on the other side of said shutter unit facing said light source for converging light upon said shutter elements.

According to the above constructed exposure device the light radiated from the light source is converged to the light condensing element and is then projected on the shutter elements, resulting in a minimum exposure time with an improved light convergence.

Moreover, according to the invention, there is provided an arrangement comprising a panel including a plurality of cells arranged in rows, each said cell consisting of display elements separately displaying color components for color display;

exposing means to form an optical image through said panel on said photosensitive member provided with photosensitive components corresponding to said color components respectively; and moving means for relatively moving, exposure by means of said exposing means, said panel relative to said photosensitive member.

In the exposure device as above constructed, the color image displayed on the panel can be repeatedly exposed on the photosensitive member with no area being unexposed, and thereby clear color image with high resolution can be obtained.

DESCRIPTION OF THE PREFERRED EMBODIMENT

Figure 1:
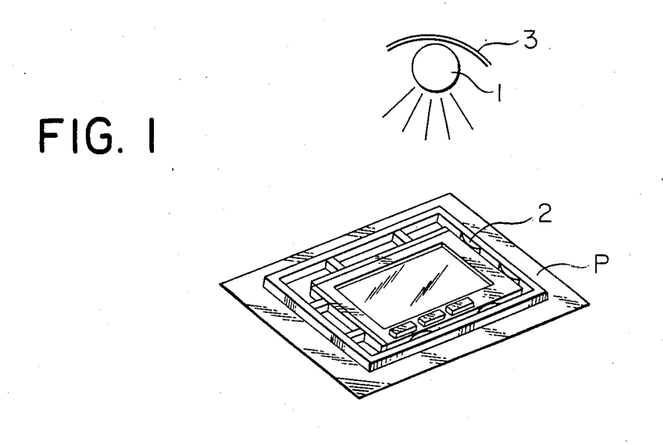
FIG. 1 is a schematic view of the exposure device embodying the invention.

FIG. 1 shows an exposure device embodying the invention wherein a light emitted from a halogen lamp 1 is directly projected to a liquid crystal shutter unit 2 placed in front of the halogen lamp 1, while it is reflected from a dichroic mirror 3 which selectively allows transmission of infrared rays and the reflected light is thrown onto the liquid crystal shutter unit 2. Adjoining the liquid crystal shutter unit 2 closely at its front side is a piece of sensitized paper P which is exposed to the light passed through the liquid crystal shutter unit 2.

Figure 2:
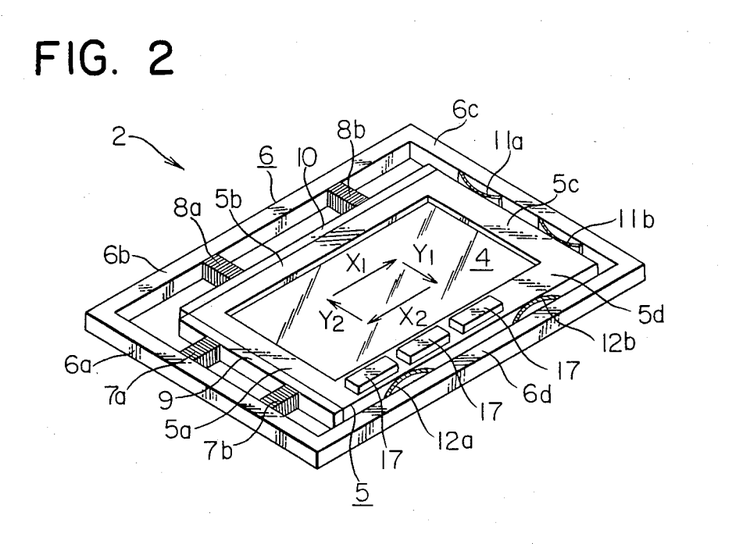
FIG. 2 is a perspective view of the shutter unit of the device shown in FIG. 2.
Figure 3A:
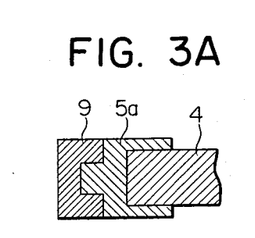
FIGS. 3(a) and 3(b) are partial vertical section of attaching a liquid crystal shutter array to brackets.
Figure 3B:
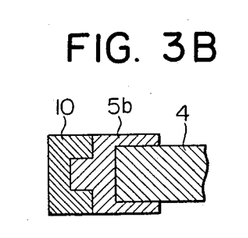

As shown in FIG. 2, a liquid crystal shutter array 4 forming a major part of the liquid crystal shutter unit 2 is carried at its four sides by a rectangular support frame 5. Another frame 6 is also of a rectangular shape which is larger than the aforementioned support frame 5. Two pairs of piezoelectric elements 7a, 7b and 8a, 8b, which are adapted to expand with a voltage applied thereto, are disposed between a pair of adjacent sides 6a and 6b of the frame 6 and the corresponding two sides 5a and 5b of the support frame 5 and are attached at their outer ends to the inner surface of the frame 6. The inner end of the piezoelectric elements 7a, 7b and 8a, 8b are secured integrally with a pair of rail-sectioned brackets 9, 10 respectively for movement together with said piezoelectric elements. As seen in FIGS. 2 and 3, the support frame 5 is at its sides 5a and 5b carried by the brackets 9, 10 to allow slidable movement of the support frame 5 in X and Y directions. Between another pair of adjacent sides 6c, 6d of the frame 6 and the corresponding sides 5c, 5d of the support frame 5 are two pairs of leaf springs 11a, 11b and 12a and 12b which provide a biasing force corresponding to the expansion of the piezoelectric elements 7a, 7b and 8a, 8b. The leaf springs 11a, 11b and 12a, 12b thus apply a biasing force to the liquid crystal shutter array 4 to move toward the piezoelectric elements 7a, 7b, 8a, 8b. With no voltage applied to the piezoelectric elements 7a, 7b, 8a, 8b the leaf springs 11a, 11b, 12a 12b are held in their free positions to maintain the liquid crystal shutter array 4 approximately at the center of the frame 6. When a voltage is applied to the piezoelectric elements 7a, 7b, 8a, 8b the liquid crystal shutter array 4 is slidably moved along the brackets 9, 10 in X and Y directions in FIG. 2 overcoming the biasing force of the leaf springs 11a, 11b, 12a, 12b.

Figure 4:
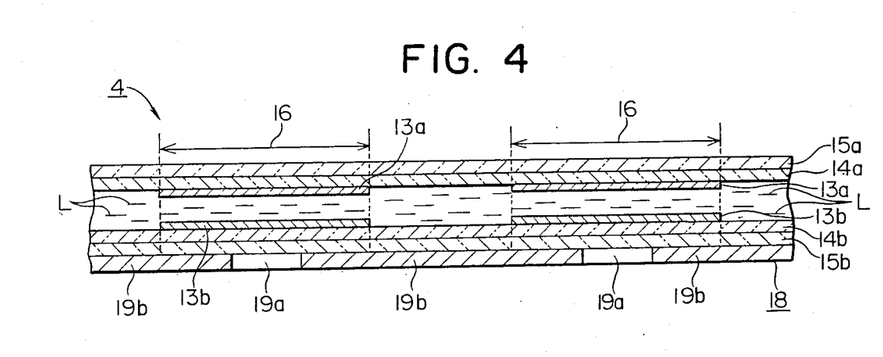
FIG. 4 is a partial vertical section of the structure of the liquid crystal shutter array.

As shown in FIG. 4, the liquid crystal shutter array unit 4 consists of a pair of upper and lower glass bases 14a and 14b each provided on its inner surface with a plurality of rectangular-shaped transparent electrodes 13a and 13b disposed at certain interval in opposing relationship to each other, liquid crystal molecules L enclosed between the glass bases 14a and 14b, and two deflector plates 15a and 15b each located on the outer surface of the glass bases 14a and 14b with its deflection axis crossing at right angle to each other. The opposing two transparent electrodes 13a and 13b, the liquid crystal molecules L between them and part of the deflector plates 15a and 15b located outward of them thus form a TN (Twisted Nematic) type liquid crystal cell 16 serving as a shutter element. Light transmission through the liquid crystal cell 16 is selectively shut out by selectively applying voltage to the opposing transparent electrodes 13a and 13b thereby changing the orientation of the liquid crystal molecules L. As shown in FIG. 2, liquid crystal controllers 17 attached to the side of the support frame 5 facing the light source is connected to the opposing transparent electrodes 13a and 13b of the liquid crystal cell 16 by way of signal-leads not shown so that the voltage applied to the opposing transparent electrodes 13a and 13b of liquid crystal cell 16 is controlled in accordance with particular picture image information.

Figure 5:
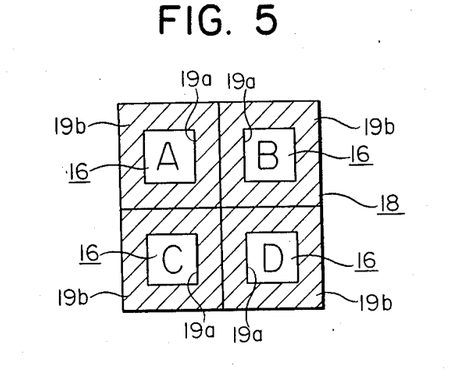
FIG. 5 is a horizontal section of four adjacent liquid crystal cells of the shutter array.

Referring to FIGS. 4 and 5, there is a light shielding member 18 attached in close contact with the side of the deflector plate 15b facing the sensitized paper. The light shielding member 18 has formed therein rectangular light transmitting areas 19a, any one size of which is set to be half the size of the opposing transparent electrodes 13a and 13b of the liquid crystal cell 16. The light transmitting area 19a is appropriately located to oppose to the corresponding transparent electrode 13a and 13b. The rest of the light shielding member 18 excluding the light transmission area 19a forms a light shielding area 19b. Therefore, the light is passed through the opposing transparent electrodes 13a and 13b. The sensitized paper P is thus exposed to the light transmitted over its particular area.

In the exposure device constructed as above, an exemplary operation is described below, in conjunction with FIG. 5, for the case where four particular liquid crystal cells A, B, C, D adjoining one another are selectively opened and closed to expose the sensitized paper P.

First of all, the liquid crystal cell 16 is selectively brought into opening or closing setting by controlling the voltage applied to the opposing transparent electrodes 13a and 13b of the liquid crystal cell 16 by means of the liquid crystal controllers 17.

Figure 6:
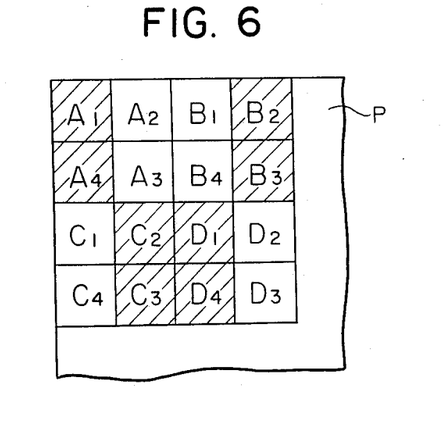
FIG. 6 is an operation explaining diagram.

For instance, A and D of the four liquid crystal cells A, B, C, D are opened and B and C closed in FIG. 5. When the halogen lamp 1 shown in FIG. 1 is turned on in this state, light is admitted through the light transmitting areas 19a of the light shielding member 18 in the liquid crystal cells A and D to expose the areas A1, D1 on the sensitized paper P as indicated by the hatched area as shown in FIG. 6, while light is shut out from the liquid crystal cells B and C to keep the areas B1, C1 unexposed.

With the halogen lamp 1 then turned off, the piezoelectric elements 7a, 7b are expanded by applying voltage to them so that the liquid crystal shutter array 4 is slid by a certain distance along the bracket 10 in X1 direction in FIG. 2 overcoming the biasing force of the leaf springs 11a and 11b. The liquid crystal cells A and D are then closed and B and C are opened by means of the liquid crystal controllers 17. When the halogen lamp 1 is again turned on, the area A2, D2 on the sensitized paper P are not exposed, while the areas B2, C2 are exposed.

Turning off the halogen lamp 1 again, a voltage is applied to the other pair of piezoelectoric elements 8a, 8b with the voltage kept applied to the piezoelectric elements 7a, 7b as well. The piezoelectric elements 8a, 8b are then expanded to slide the liquid crystal shutter array 4 along the bracket 9 in Y1 direction of FIG. 2 against the biasing force of the leaf spring 12a, 12b. When the halogen lamp 1 is turned on with such opening and closing setting on those liquid crystal cells A through D maintained as above, the areas A3, D3 are exposed.

With the halogen lamp 1 turned off, the piezoelectric elements 7a, 7b are relieved of voltage with a voltage kept applied to the piezoelectric elements 8a, 8b. The piezoelectric elements 7a, 7b are then contracted back to their initial positions so that the liquid crystal shutter array 4 is slid back along the bracket 10 in X2 direction of FIG. 2 by virtue of the biasing force of the leaf springs 11a, 11b. The liquid crystal controllers 17 then open the liquid crystal cells A, D and close B and C. When the halogen lamp 1 is turned on in this state, the areas A4, D4 are exposed on the sensitized paper P with the area B4, C4 unexposed. The whole exposing process is thus completed with the areas A1, A4, B2, B3, C2, C3, D1, D4 exposed as indicated by the hatched area in FIG. 6 but with the areas A2, A3, B1, B4, C1, C4, D2, D3 left unexposed. When the voltage to the piezoelectric elements 8a, 8b now stops, the liquid crystal shutter array 4 is returned in Y2 direction of FIG. 2 by virtue of the biasing force of the leaf springs 12a, 12b so that the liquid crystal shutter array 4 resumes its initial position.

According to the above constructed exposure device, therefore, one exposure area corresponding to each liquid crystal cell 16 is divided into four exposure segments each of which is smaller than the pitch of those liquid crystal cells. This makes the exposed area clearly delimited from the unexposed area, providing an image with higher resolution. Also in this embodiment, the sensitized paper P is placed in close contact with the shutter unit 2, permitting to use a less expensive light source with lower level of light emission.

In the exposing process as above described, four consecutive exposures while continuously wobbling the liquid crystal shutter array 4 may take place with the halogen lamp 1 kept lit, provided the time required for opening and closing the liquid crystal array 4 and the time for wobbling the liquid crystal shutter array 4 are enough shorter than the time taken for one exposure.

Figure 7:
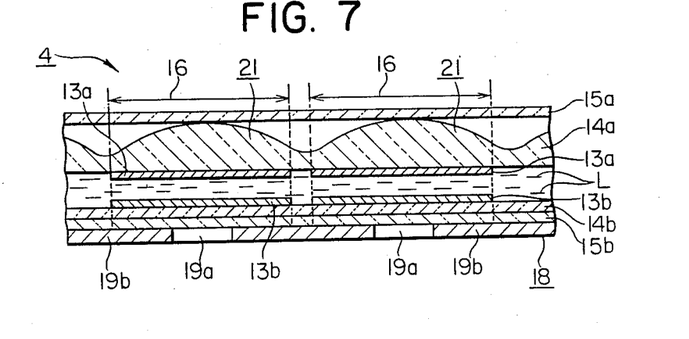
FIG. 7 is a partial vertical section showing another embodiment of the liquid crystal shutter array.

FIG. 7 shows a modified embodiment of the liquid crystal shutter array unit 4, wherein a micro lens array 21 is provided to condense light from the halogen lamp 1 onto each liquid crystal cell 16 in order to converge the light onto the light transmission area 19a of the light shielding member 18.

This modified unit 4 not only provides an image with a higher resolution but also ensures a minimized exposure time because of more efficient light convergence from the halogen lamp 1.

In the meantime, in the aforementioned embodiment, guest/host type or other suitable type may be used instead of the TN type for the liquid crystal cell 7 forming the liquid crystal shutter array unit 2. Further, the sensitized element may be made of self-developing type light/pressure sensitized paper formed by coating a paper carrier with photo-setting resin as sensitizing agent, micro capsules enclosing predye agent and developing agent. Also, a separate-type light/pressure sensitized paper may be used instead, which is coated with abovementioned micro capsules only, while having a separate transfer sheet coated with developing agent. Further, Photoresist for semiconductor subtrates may be used as a sensitized element.

Moreover, the effective area of the light transmission area 19a of the light shielding member 8 may be appropriately varied with respect to the area of the opposing transparent electrode 13a or 13b of the liquid crystal cell 16. Further, micro lens array 21 for light collection may be integral with the glass base 5a.

Figure 8:
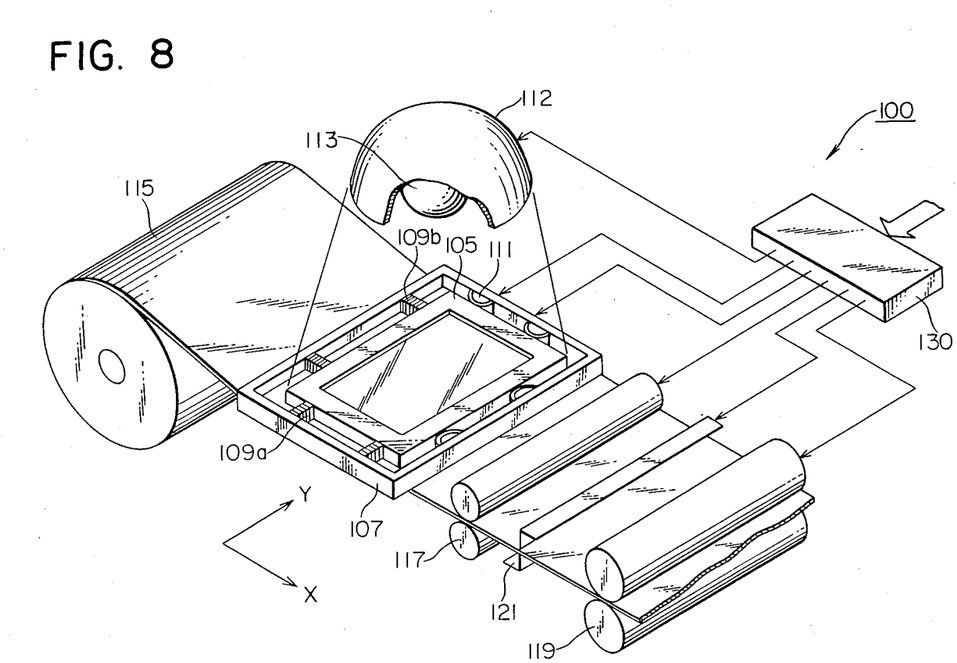
FIG. 8 is a schematic structural view of important parts of a color printer adopting an exposure device embodying the invention.

FIG. 8 shows a fundamental construction of a color printer 100 embodying the invention, with its housing or the like omitted for simplicity. The color printer 1 records images with a color liquid crystal panel 105 and a light/pressure sensitive paper 115 closely adjoining the panel 105. The construction of the color liquid crystal panel 105 is first explained below.

Inside a frame 107 fitted with the color liquid crystal panel 105, provided are bimorph piezoelective elements 109a, 109b and leaf springs 111 located in opposition to the bimorph piezoelectric elements 109a, 109b both in X and Y directions for clamping the color liquid crystal panel 105 therebetween. The bimorph piezoelectric elements 109a and 109b are expanded in length in response to a certain voltage applied to them so that the color liquid crystal panel 105 is moved by a certain distance in X and Y directions.

The color liquid crystal panel 105 is comprised of a known structure of active matrix type liquid crystal panel with picture elements of 480 in width×378 in height and a filter with a number of regularly arranged cells each including red, green and blue elements, which is laid closely upon the panel 105. The color liquid crystal panel 105 forms color images thereon by applying a voltage to selected picture elements each of which serves as a shutter element.

Above the frame 107 installed is a halogen lamp 113 housed in a condensing concave mirror 112. The light/pressure sensitive paper 115 directly adjoins the frame 107 and the back side of the color liquid crystal panel 105.

The light/pressure sensitive paper 115 is formed by placing three kinds of micro-capsules mode of photocurable resins which is hardened, respectively, in response to blue, green and red color light uniformly on its surface coated with chromogenic materials, as has been described in the U.S. Patent Application No. 32,863. In the micro capsules of photo-curable resins sensitive to blue, green and red colored lights contain therein dye precursor which developes yellow, magenta and cyan in reaction with chromogenic materials. Such paper 115 is formed into a roll which is conveyed via a path including the color liquid crystal panel 105, conveyer rollers 117, power cutter 121 and pressing rollers 119.

Color liquid crystal panel 105, bimorph piezoelectric elements 109a, 109b, halogen lamp 113, rollers 117, 119 and power cutter 121 are all connected to an electronic control unit 130 (hereinafter referred to as "ECU") for driving and controlling them.

Figure 9:
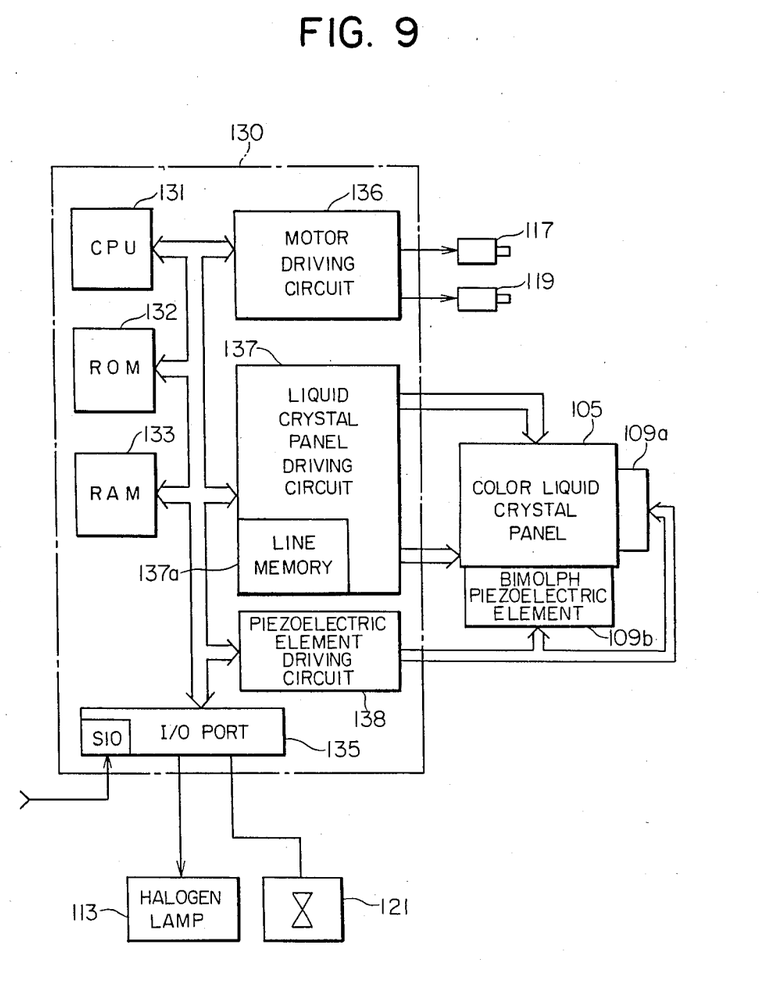
FIG. 9 is a block diagram showing the configuration of an electronic control unit for the color printer shown in FIG. 8.

ECU 130 comprises as illustrated in FIG. 9, CPU (Central Processing Unit) 131, ROM (Read-Only Memory) 132, RAM (Random Access Memory) 133 as its central elements, and connected therewith via a bus line are an input/output port 135, a motor drive circuit 136, a liquid crystal panel drive circuit 137 and a piezoelectric element drive circuit 138. The input/output port 135 is provided with a serial input interface (hereinafter referred to as "SIO"), through which serial data are entered from a data output device, not shown, while it is also connected with the halogen lamp 113 and the power cutter 121.

The CPU 131 delivers control signals to the halogen lamp 113 and the power cutter 121 through the input/output port 135.

The piezoelectric element drive circuit 138 is connected to the bimorph piezoelectric elements 109a, 109b to apply a certain voltage to move them in X or Y direction independently of each other in response to the command from the CPU 131. The bimorph piezoelectric elements 109a, 109b are expanded in length corresponding to the voltage applied to them.

The liquid crystal panel drive circuit 137 to which the panel 105 is connected incorporates a line memory 137a in which the images to be displayed are fed by the CPU 131. The images are then cyclically read out by the liquid crystal panel drive circuit 137 to be displayed on the color liquid crystal panel 105. The line memory 137a stores the images by means of dot patterns for respective colors. The liquid crystal panel drive circuit 137 then represents the data in the line memory 137a on the color liquid crystal panel 105. That is, the display on the liquid crystal panel 105 is performed by a so-called bit map display method.

The motor drive circuit 136 is connected to motors, not shown, for conveyer rollers 117 and pressure rollers 119 so that the roll of the sensitive paper 115 is drew out, conveyed and pressurized in response to the control signals from the CPU 131.

Figure 10:
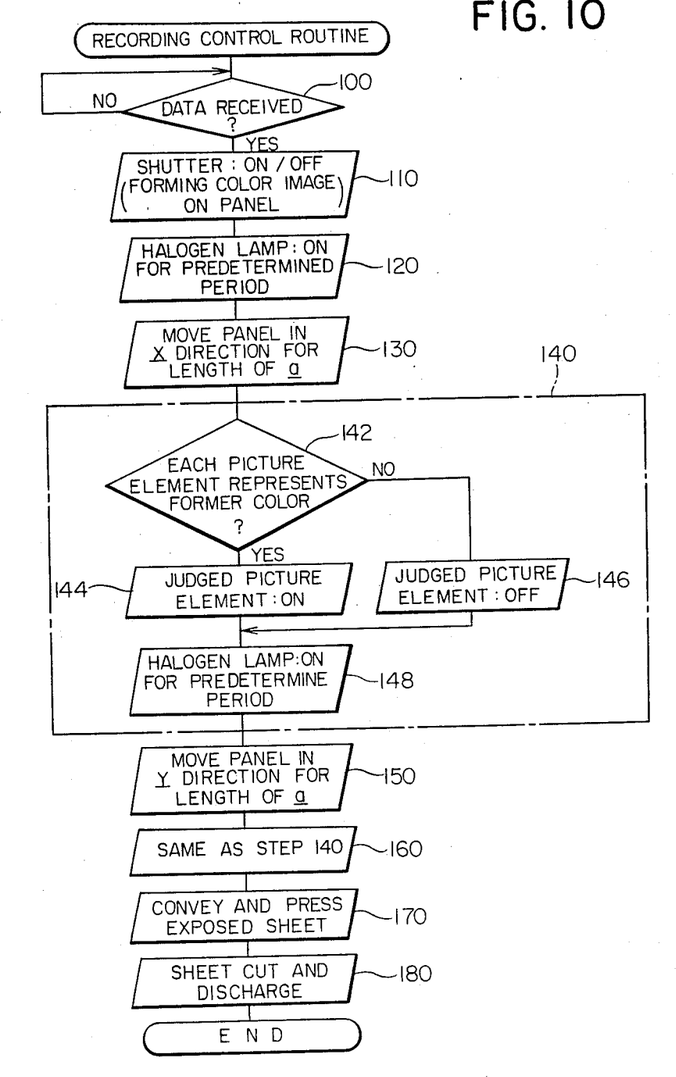
FIG. 10 is a summarized flow chart explaining an exposure operation carried by the color printer shown in FIG. 8.

A control program for operating the printer 100 stored in the ROM 132 in the ECU 130 is as illustrated in FIG. 10 which is a summarized flow chart for print controlling routine.

When the color printer 100 is turned on, the CPU 131 in the ECU 130 starts up to bring all the parts into initial settings, while sending a control signal to the motor drive circuit 136 to drive the conveyer rollers 117. The conveyer rollers 117 rotates at certain revolutions to place the sensitive paper 115 on the back side of the color liquid crystal panel 105.

In the subsequent processing, serial data are received from the data output device not shown through the SIO of the input/output port 135. RAM 133 as a buffer memory keeps storing the received data until they reaches a predetermined amount (step 100). When the data stored in the RAM 133 exceeds the predetermined amount, the CPU 131 transfers the preset amount of data for display from RAM 133 to the line memory 137a of the liquid crystal panel drive circuit 137, so that the latter circuit 137 cyclically reads data out of the line memory 137a to display image data on the liquid crystal panel 5 (step 110). This is followed by lighting the halogen lamp 113 for a predetermined period (about 3 seconds in this embodiment) to expose color images to the sensitive paper 115 (step 120).

Figure 11:
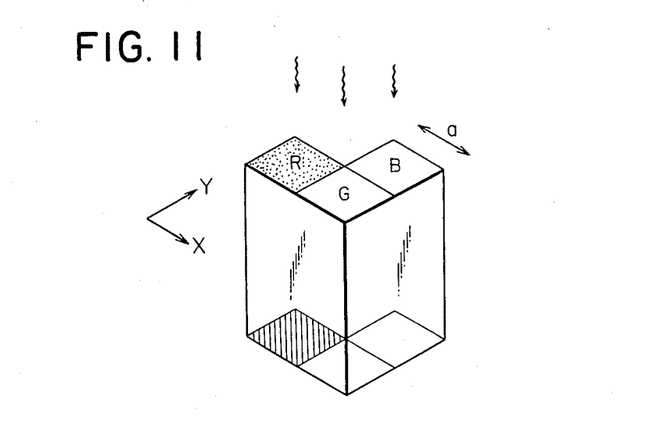
FIG. 11 is a schematic explanatory diagram to show the manner of exposing.

FIG. 11 is an explanatory view for schematically showing the manner of exposing. Assume Red is represented in a particular cell of the color liquid crystal panel 105. When the halogen lamp 113 is lit, therefore, the light from the lamp 113 is transmitted through only the red (R) picture element within the cell to expose the corresponding area (hatched in the drawing) of the sensitive paper 115.

When the halogen lamp 113 is then turned off, the CPU 131 applies a certain voltage to the bimorph piezoelectric element 109b by means of the drive circuit 138 to expand its length. This causes the color liquid crystal panel 105 to be moved by a distance a corresponding to the length of one picture element in the X direction (step 130).

The next step 142 is to determine whether each picture element after movement represents the color of the cell positioned there before movement. If the cell before movement is of the same color as that of the picture element after movement, the picture element is turned on to allow light to be transmitted therethrough (step 144). Otherwise, the picture element is turned off to shut the light out (step 146).

Figure 12A:
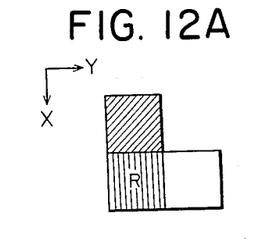
FIGS. 12A and 12B are an explanatory views showing the state of exposure.
Figure 12B:
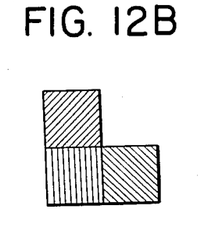

Referring to the cell taken as an example, the red (R) element is moved to the area where the green (G) element was present. Since the cell including this element is colored red, the red (R) element is kept on after movement. On the other hand, the green (G) and blue (B) elements are turned on, only when the cell including the corresponding elements before movement is colored green or red. When in this state the halogen lamp 113 is turned on, the sensitized paper 115 is exposed to light as illustrated in FIG. 12A (step 148). The same exposing procedures then take place for movement in Y direction (step 150, step 160). As a result, all the areas of sensitive paper corresponding to the cells are entirely exposed as illustrated in FIG. 12B.

When exposure is completed, the CPU 131 drives the motor drive circuit 136 to rotate the conveyer rollers 117 so that the exposed paper 115 is fed out to be pressurized by the pressure rollers 119 (step 170). Under pressure, the micro-capsules coated on the sensitive paper 115 which have not been exposed to light are destroyed to allow the dye precursor to flow out. The dye precursor thus flown out reacts with chromogenic materials on the surface of the paper 115 to develop bright-colored images thereon. The paper 115 is then cut to a certain length by the power cutter 121 and is sent to the outlet, not shown (step 180).

As described above, the color printer 100 embodying the invention provides bright-colored images by exposing a desired image formed on the color liquid crystal panel 105 three times, once before movement, twice after movement in respective X and Y directions so that every one of the areas on the paper 115 corresponding to the cells is exposed to light. In order to record white, the light transmitted through the R, G and B elements is similarly radiated to the corresponding area of the paper 115 three times, producing a real clear white.

Figure 13A:
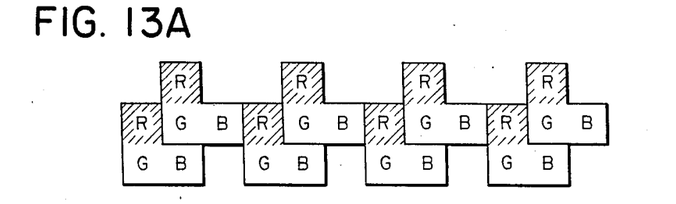
FIGS. 13A through 13D are explanatory views of recording linear images.

It is now described below with reference to the schematic explanatory diagram in FIG. 13 to record images with higher resolution. Each area of the paper 115 which corresponds to each picture element of the color liquid crystal panel 105 is represented by m and n (m and n stand for the number of line and the number of column, respectively). In conventional ways of exposure, even if any data carries high resolution, it has been suppressed by a lower resolution of the color liquid crystal panel 105 so that the recorded image could not surpass the resolution of the liquid crystal panel. More specifically, with a light of higher resolution, the sensitized paper 115 microscopically looks finely streaked, as illustrated in FIG. 13A. This problem is overcome in a manner described below.

Figure 13B:
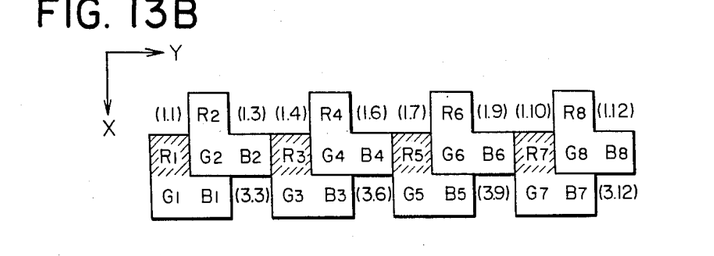
Figure 13C:
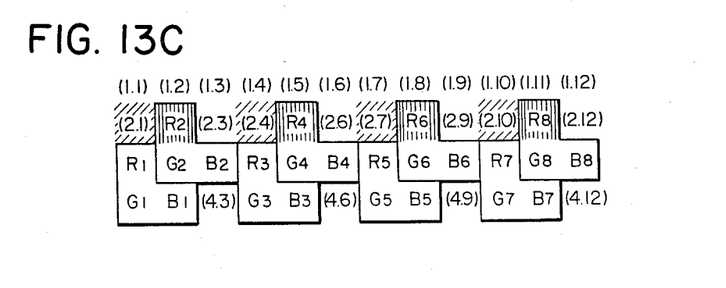
Figure 13D:
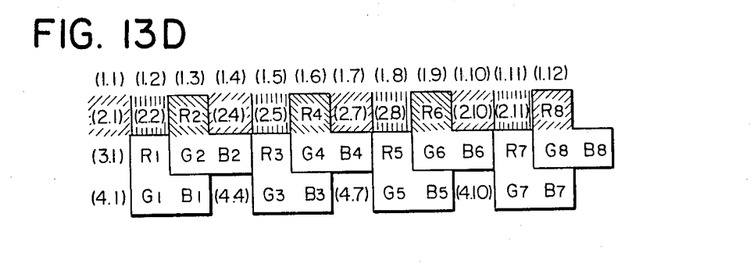

As shown in FIG. 13B, R1, R3, R5, R7 picture elements are turned on first to expose the areas (2.1), (2.4), (2.7), (2.10). This is followed by movement of the color liquid crystal panel 105 in X direction so that R2, R4, R6, R8 elements are turned to expose (2.2), (2.5), (2.8), (2.1) areas as illustrated in FIG. 13C. The color liquid crystal panel 105 is then further moved in Y direction so that R2, R4, R6, R8 elements are turned on to expose (2.3), (2.6), (2.9), (2.12) areas of the paper 115 as illustrated in FIG. 13D. Resolution of three times that with earlier exposure is obtained by thus turning on and off those picture elements upon every movement in X and Y directions. If R, G, B elements of color liquid crystal panel 105 are arranged accurately in rows extending, for instance, in X direction, there is no need of mounting bimorph cell 109a in Y direction of the frame, only if the bimorph cell 109b is made variable in two different lengths in X direction (e.g., by expanding and contracting).

As has been described above, in the above constructed color printer, upon exposure by means of exposing means, the relative position of the panel to the sensitive sheet is moved by the moving means so that every area of the sheet corresponding to the picture element on the panel is exposed entirely, providing bright color images as a whole. In consequence, if the specified image area of the panel is white, the display element of each color is exposed on the corresponding area of the sheet three times reproducing a bright white color. Also, images are printed on the sheet with a higher resolution than on the panel by turning on and off exposure upon every movement of picture elements of the panel.

What is claimed is:

1. An exposure device for forming an image on a photosensitive member comprising:
   a light source;
   a shutter unit disposed between said photosensitive member and said light source, said shutter unit including a plurality of shutter elements adapted to open and close for selective transmission of light from said light source therethrough, said shutter elements being arranged in rows extending lengthwise and crosswise;
   driving means for reciprocally moving the shutter unit along the rows of said shutter elements both in the lengthwise direction and the crosswise direction; and
   control means for controlling opening and closing of the shutter elements.

2. The exposure device according to claim 1, wherein said shutter unit comprises a liquid crystal shutter array.

3. The exposure device according to claim 2 wherein said liquid crystal shutter array comprises:
   a pair of upper and lower glass bases, each provided on its inner surface with a number of pairs of rectangular-shaped transparent electrodes disposed at certain intervals in opposing relationship to each other to form said shutter elements;

liquid crystal molecules enveloped between said glass bases; and two deflector plates each located on the outer surface of said glass bases with its deflection axis crossing at right angle to each other.

4. The exposing device according to claim 3 wherein said liquid crystal shutter array further comprises light condensing means for converging light upon said shutter elements.

5. The exposing device according to claim 4 wherein said light condensing means comprises a microlens array.

6. The exposing device according to claim 2 which further comprises a light shielding member provided at the side of said liquid crystal shutter array facing the photosensitive member, said light shielding member being provided with a plurality of rectangular light transmitting areas, each of which is located to oppose to the corresponding pair of transparent electrodes.

7. The exposing device according to claim 6 wherein each said light transmitting area of said light shielding member is set to be half the size of said opposing transparent electrodes of said shutter element.

8. The exposure device according to claim 1 which further comprises an outer frame for supporting said shutter unit, and wherein said driving means comprises piezoelectric elements adapted to deform in response to a voltage applied thereto and spring means developing biasing force in response to said deformation of said piezoelectric elements, said piezoelectric elements and said spring means being arranged between said frame and said shutter unit.

9. The exposure device according to claim 3 wherein said spring means comprises leaf springs.

10. An exposure device for forming an image on a photosensitive member comprising:
a light source;
a shutter unit disposed between said photosensitive member and said light source, said shutter unit including a plurality of shutter elements arranged in rows and adapted to open and close for selective transmission of light from said light source therethrough;
an outer frame for supporting said shutter unit;
driving means for reciprocally moving the shutter unit along the rows of said shutter elements, said driving means comprising piezoelectric elements adapted to deform in response to a voltage applied thereto and spring means being opposedly arranged at each pair of opposed sides of said shutter unit; and
control means for controlling opening and closing of the shutter elements.

11. The exposure device according to claim 10 which further comprises a pair of brackets, each secured and having a rail-sectioned inner surface for slidably engaging with said shutter unit.

12. An exposure device for forming an image on a photosensitive member comprising:
a light source,
a shutter unit disposed between said photosensitive member and said light source, said shutter unit including a plurality of shutter elements adapted to open and close for selective transmission of the light source therethrough said shutter elements being arranged in the rows extending lengthwise as well as crosswise, and a light shielding member provided to said shutter unit to prevent light from passing through the surroundings of said shutter elements, said light shielding member being provided with a plurality of rectangular light transmitting areas, each of which is located to oppose to the corresponding area of said light shielding member being set to be half the size of said shutter element.

13. An exposure device for forming an image on a photosensitive member comprising;
a light source;
a shutter unit disposed between said photosensitive member and said light source, said shutter unit including a plurality of shutter elements adapted to open and close for selective transmission of light from said light source therethrough;
a light shielding member provided on one side of said shutter unit facing said photosensitive member to prevent light from passing through the surroundings of said shutter elements; and
light condensing means comprising a micro-lens array provided on the other side of said shutter unit facing the light source for converging light upon said shutter elements.

14. A device for forming a color image on a photosensitive member comprising:
a panel including a plurality of cells arranged in rows, each said cell consisting of display elements separately displaying color components for color display;
exposing means to form an optical image through said panel on said photosensitive member provided with photosensitive components corresponding to said color components respectively; and
moving means for moving, upon exposure by means of said exposing means, said panel relative to said photosensitive member.

15. A device for forming a color image on a photosensitive member comprising
a light source;
a shutter unit disposed between said photosensitive member and said light source, said shutter unit comprising a liquid crystal panel having a plurality of picture elements adapted to open and close for selective transmission of the light from said light source therethrough, said liquid crystal panel being overlapped with a filter having a number of regularly arranged cells each including red, green and blue elements corresponding to said picture elements;
driving means for reciprocally moving the shutter unit along the row of said picture elements; and
control means for controlling opening and closure of said picture elements.

16. The device according to claim 15 which further comprises an outer frame for supporting said shutter unit, and wherein said driving means comprises bimorph piezoelectric elements adapted to displace in response to a voltage applied thereto and spring means developing biasing force in response to said displacement of said bimorph piezoelectric elements, said bimorph piezoelectric elements and said spring means being arranged between said frame and said shutter unit.

17. The exposure device according to claim 16 wherein said spring means comprises leaf springs.

18. The exposure device according to claim 15 wherein said light source comprises a halogen lamp housed in a condensing concave mirror.

19. The exposure device according to claim 15 wherein said control means includes means for judging, when said shutter unit is moved by said driving means after exposure, whether each picture element represents a same color as being represented in the cell positioned there before movement, and means for opening the picture elements judged as representing said same color for further exposure.

20. The exposure device according to claim 19 wherein said shutter unit is twice moved for exposing all the areas of said photosensitive member corresponding to all of said picture elements by triple exposures.

21. A liquid crystal shutter array comprising:
a pair of upper and lower glass bases, each provided on its inner surface with a number of pairs of rectangular-shaped transparent electrodes disposed at certain intervals in opposing relationship to each other to form shutter elements;
liquid crystal molecules enveloped between said glass bases; and
a pair of upper and lower deflector plates each located on the outer surface of said glass bases with its deflection axis crossing at right angle to each other,
wherein the upper glass base comprises a micro-lens array arranged for converging light upon said shutter elements; and
a light shielding member is superposed on the outer surface of the lower deflector plate to prevent light from passing through the surrounding of said shutter elements.

* * * * *